United States Patent [19]
DeMarco et al.

[11] Patent Number: 5,633,103
[45] Date of Patent: May 27, 1997

[54] SELF-ALIGNED ALIGNMENT MARKS FOR PHASE-SHIFTING MASKS

[75] Inventors: John J. DeMarco, East Brunswick, N.J.; Christophe Pierrat, Boise, Id.

[73] Assignee: Lucent Technologies Inc., Murray Hill, N.J.

[21] Appl. No.: 500,729

[22] Filed: Jul. 11, 1995

Related U.S. Application Data

[63] Continuation-in-part of Ser. No. 331,308, Oct. 28, 1994, abandoned.

[51] Int. Cl.$^6$ .................................................. G03F 9/00
[52] U.S. Cl. ........................... 430/5; 430/22; 356/399
[58] Field of Search ........................... 430/5, 22, 322; 356/399, 400, 401

Primary Examiner—S. Rosasco
Attorney, Agent, or Firm—David I. Caplan

[57] ABSTRACT

A phase-shifting optical lithographic mask has a set of phase shifting features and a set of alignment marks, all having a common thickness and being made of a common material, such as chromium oxynitride, that is partially transparent to optical radiation used in an optical lithographic system. Both of these sets are located on a slab of quartz. An alignment shutter layer laterally intervenes between the alignment marks and the phase-shifting features, in order to suppress optical radiation leakage from the phase-shifting features to the alignment areas. A portion of the top surface of the alignment shutter layer and the entire top surface of the reinforced alignment marks are reinforced by an opaque layer, such as chrome. In addition, another similarly reinforced layer, a chip shutter layer, can be laterally located at an extremity of the reinforced alignment marks, in order to suppress optical radiation leakage from one chip area to another in step-and-repeat lithography.

20 Claims, 2 Drawing Sheets

SELF-ALIGNED ALIGNMENT MARKS FOR PHASE-SHIFTING MASKS

RELATED APPLICATIONS

This application is a continuation-in-part of our application Ser. No. 08/331,308 filed on Oct. 28, 1994, now abandoned, which is hereby incorporated herein.

TECHNICAL FIELD

This invention relates to optical lithography, such as that used for fabricating semiconductor integrated circuit and other devices. More particularly, the invention relates to optical lithographic masks and to methods of making such masks, for use in optical lithographic systems for fabricating such devices. These masks are also called "reticles" particularly when they are used in optical systems having magnifications different from unity.

BACKGROUND OF THE INVENTION

FIG. 1 shows an optical lithographic fabrication system 100 for delineating features in a workpiece 120, in accordance with prior art. Typically the workpiece 120 comprises a semiconductor wafer (substrate), together with one or more layers of substances (not shown) located on a top major surface of the wafer.

More specifically, typically substantially monochromatic optical radiation of wavelength $\lambda$, emitted by an optical source 106, such as a mercury lamp, propagates successively through a pinhole aperture in an opaque screen 105, an optical collimating lens or lens system 104, a patterned lithographic mask or reticle 103 having a pattern of features in the form of apertures (bright regions) in an opaque material, and an optical focusing lens or lens system 102. The optical radiation emanating from the reticle 103 is focused by the lens 102 onto a photoresist layer 101 located on the top major surface of the workpiece 120. Thus the pattern of the reticle 103—that is, its pattern of transparent and opaque portions—is focused on the photoresist layer 101. Depending upon whether this photoresist is positive or negative, when it is subjected to a development process, typically a wet developer, the material of the photoresist is removed or remains intact at and only at areas where the optical radiation was incident. Thus, the pattern of the mask is transferred to ("printed on") the photoresist layer 101.

Subsequent etching processes, such as wet etching or dry plasma etching, remove selected portions of the workpiece 120 typically comprising a semiconductor wafer. Thus, portions of the workpiece 120 are removed from the top surface of the workpiece 120 at areas underlying those where the photoresist layer 101 was removed by the development process but not at areas underlying those regions where the photoresist remains intact. Alternatively, instead of etching the workpiece, impurity ions can be implanted into the workpiece 120 at areas underlying those where the photoresist layer was removed by the development process but not at areas underlying where the photoresist remains. Thus, in any event, the pattern of the mask 103—i.e., each feature of the mask—is transferred to the workpiece 120 as is desired, for example, in the art of semiconductor integrated circuit fabrication.

As known in the art, the aperture 15 is located on the focal plane of the collimating lens 104, and the indicated distances L1 and L2 satisfy in cases of a simple lens 102: $1/L1 + 1/L2 = 1/F$, where F is the focal length of the lens 102.

In fabricating integrated circuits, it is desirable, for example, to have as many transistors per wafer as possible.

Hence, it is desirable to make transistor sizes as small as possible. Similarly it is desirable to make as small as possible any other feature size, such as the feature size of a metallization stripe—i.e., its width—or of an aperture in an insulating layer that is to be filled with metal, for example, in order to form electrical connections between one level of metallization and another.

According to geometric optics if it is desired to print on the photoresist layer 101 the corresponding feature having a width equal to W, a feature having a width equal to C must be located on the mask (reticle) 103. Further, according to geometric optics if this feature of width equal to C is a simple aperture in an opaque layer, then the ratio $W/C=m$, where $m=L2/L1$, and where m is known as the "lateral magnification". When diffraction effects become important, however, instead of a sharp black-white image a diffraction pattern of the object feature C is formed on the photoresist layer 101, whereby the edges of the image become indistinct. Consequently, the resolution of the features of the reticle 103, as focused on the photoresist layer and transferred to the workpiece, deteriorates.

In prior art this diffraction problem has been alleviated by such techniques as using phase-shifting portions ("phase-shifting features") on the mask. Therefore the mask is then known as a "phase-shifting mask"—and hereinafter the mask 103 will therefore likewise be called "the phase-shifting mask 103". These phase-shifting features impart a phase shift $\phi$ to the optical beam emanating from the optical source 106, with $\phi$ typically equal to approximately $\pi$ (=180°).

Phase-shifting features can be either opaque (i.e., with an optical intensity transmission coefficient, T, approximately equal to 0) or partially transparent (i.e., with the value of T advantageously being in the approximate range of 0.05 to 0.15, typically T being approximately equal to 0.10)—all as measured with respect to the optical radiation of wavelength $\lambda$. Thus, in a phase-shifting mask, the features such as that shown in the form of a simple aperture C in the mask 103 will become more complicated than just simple apertures and will include the above-mentioned phase-shifting features (not shown).

Typically, for use in the system 100, the phase-shifting mask 103 has two basic areas: (a) feature areas, and (b) alignment areas. That is to say, the phase-shifting mask 103 has the following basic areas: (a) feature areas whereby the images formed by them on the photoresist layer 101 correspond to device features of the workpiece 120 (such as selected areas of the workpiece 120 where impurity ions are implanted on selected areas of the workpiece 120 where portions of the workpiece 120 are removed), and (b) workpiece fabrication alignment areas thereof whereby the images formed on the photoresist layer 101 correspond to workpiece fabrication alignment marks.

As known in the art, in a step-and repeat movement procedure for forming images on the photoresist layer 101, the workpiece 120 is subdivided into chip ("die") subregions: each subregion typically is defined and encompassed by one resulting step-and-repeat position of the workpiece 120 (overlain by the photoresist layer 101). Each corresponding subregion of the photoresist layer 101 is successively exposed to the optical beam in the system 100. In order to align the system 100 for the step-and-repeat process, step-and-repeat alignment marks are required on the mask 103 in addition to the workpiece alignment fabrication marks.

As further known in the art, in the system 100 an unwanted diffraction of optical radiation causes an undesirable leakage of optical radiation from one area on the photoresist layer 101 to another. During a step-and-repeat procedure, this leakage will expose areas of the photoresist layer 101 overlying adjacent chip subregions of the workpiece 120 to an undesirable optical radiation background if the adjacent chip subregions are located in close proximity. Therefore this leakage causes undesirable deterioration of the sharpness of definition of features of adjacent chip subregions. In addition to this (step-and-repeat) leakage, an unwanted optical radiation leakage from the feature areas to the alignment areas on the photoresist layer 101 undesirably can reduce the sharpness of definition (contrast ratio) of the images of the alignment marks on the photoresist layer 101; hence, this leakage can cause a deterioration of the sharpness of definition of the positions of the features ultimately formed in the workpiece 120.

To minimize these optical radiation backgrounds-instead of increasing the distance between chips (as defined by the step-and-repeat procedure) or the distance between feature areas and alignment areas, whereby precious feature area on the workpiece 120 would be sacrificed-in prior art an opaque shutter layer is introduced on the mask 103 between the alignment areas and the boundaries of the chip subregions, as well as between the feature areas and the alignment areas. In the interest of economy of processing, workers in prior art formed these shutter layer simultaneously with forming the opaque layers (T=0) of the phase-shifting areas. However, in cases where the phase-shifting features are partially transparent (i.e., in cases where T≠0), such a method would produce alignment marks and shutter layers that would likewise be partially transparent, whereby the alignment of the photoresist layer 101 during the step-and-repeat procedure as well as during exposure to the optical beam in the system 100 would be compromised, and an undesirable amount of leakage would persist.

SUMMARY OF THE INVENTION

This invention involves a phase-shifting mask that can be used in the system 100. The inventive mask has partially transparent phase-shifting features together with alignment marks that are reinforced (rendered opaque) and are self-aligned with respect to the phase-shifting features. The thus self-aligned reinforced alignment marks are either workpiece fabrication alignment marks, step-and-repeat alignment marks, or both. The optical radiation leakage is reduced by virtue of an opaque shutter layer located between feature areas and alignment areas of the mask. The mask can also have a reinforced (opaque) shutter layer that prevents optical radiation leakage from the feature areas to the alignment areas on the photoresist layer 101. In some embodiments the mask further has a reinforced shutter layer to prevent leakage of optical radiation from one chip area to another. The invention also involves a method for making such masks.

In a specific embodiment, a phase-shifting mask in accordance with the invention comprises:

(a) a substrate that is transparent to optical radiation of wavelength λ;

(b) a patterned layer of elements each of which comprises a layer of a first material that is partially transparent to the optical radiation of wavelength λ and is located on a top major surface of the substrate;

(c) one or more reinforced alignment marks located on the top major surface of the substrate, each of the alignment marks comprising a layer of the first material having a top major surface that is entirely overlain with a layer of second material that is chemically different from that of the first material, a lateral space thereby being defined between one of the alignment marks and an adjacent one of the elements, each of the reinforced marks being opaque with respect to the optical radiation of wavelength λ;

(d) a reinforced alignment shutter layer comprising a layer of the first material having only a portion of a top major surface thereof overlain with a layer of the second material, neither the lateral space nor any of the elements being overlain with any of the second material.

The layer of first material contained in the patterned layer of elements, in the reinforced alignment marks, and in the reinforced alignment shutter layer have a common first thickness. The layer of second material contained in the reinforced alignment marks and in the reinforced alignment shutter layer have a common second thickness.

Advantageously the mask further comprises a reinforced chip, located on the top major surface of the substrate, comprising a pair of layers of the first and second materials, respectively. These layers of the first and second materials the same lateral extents, respectively, and their respective thicknesses are equal to the common first and second thicknesses mentioned above.

It is advantageous that the first material is essentially chromium oxynitride. It is further advantageous that the second material is essentially chrome or chromium oxide.

In another specific embodiment, a phase-shifting mask in accordance with the invention is formed by a sequence of steps comprising:

(a) providing a transparent substrate on a top major surface of which is located a patterned layer of first material having a common first thickness h and that is partially transparent to optical radiation of a wavelength λ, the patterned layer having respective portions located within at least first and second areas of the top major surface;

(b) forming a photoresist layer of height H on the top surface of the patterned layer and on the top major surface of the substrate;

(c) bombarding, with an electron beam, the photoresist layer at all regions thereof everywhere overlying the first area, at a region thereof extending between mutually adjacent layers of the first and second areas, and at only a portion of the region thereof overlying the second area;

(d) directing an optical beam everywhere on the bottom surface of the photoresist layer before, during, or after step (c);

(e) developing the photoresist layer, whereby only some lateral portions of the photoresist layer are removed while other lateral portions remain intact;

(f) depositing a layer of second material that is chemically different from the first material; and (g) stripping (removing) the remaining photoresist layer, so that the layer of second material is removed at all regions overlying the remaining photoresist layer but is not removed elsewhere.

During step (e), the language "some lateral portions of the photoresist layer are removed" refers to the situation in which essentially the entire thickness of the photoresist layer is removed only at certain laterally defined portions of the photoresist layer. The other lateral portions of the photoresist layer remain intact. The lateral portions of the photoresist layer that remain intact are: (1) those lateral portions that were bombarded by the electron beam, and (2) those lateral portions that are located within the second area but neither were bombarded by the electron beam nor overlie the patterned layer.

During step (f) the layer of second material advantageously is thereby deposited everywhere on the top surface of the remaining portion of the photoresist layer and on all areas of the patterned layer that are not overlain with the remaining portion of the photoresist layer. Moreover, during step (f) the layer of second material is deposited to a thickness that is sufficient to render this layer of second material, in combination with the patterned layer, opaque to the radiation of wavelength $\lambda$.

Preferably, the thickness of the layer of second material is less than approximately one-third the quantity (H−h). Typically the second material is chromium or chromium oxide. Alternatively it can be chromium oxynitride having a sufficient thickness to render the mask opaque, typically a thickness of approximately 500 angstrom (50 nm) provided that the composition of the chromium oxynitride is sufficiently rich in chromium.

In this way an optical photolithographic mask is made that can be used as the mask 103 as described above in conjunction with the system 100. As made in this way in accordance with the invention, the resulting mask has self-aligned reinforced alignment marks, as well as a reinforced alignment shutter layer that prevent leakage of optical radiation feature area to alignment areas.

Advantageously, the reinforced alignment shutter layer is formed simultaneously with the forming of the reinforced alignment marks. Hence the reinforced shutter layer can also be self-aligned.

In addition, the mask can further have a reinforced chip shutter layer that suppresses leakage of optical radiation on the photoresist layer 103 from one chip area to another, as can occur in step-and-repeat chip processing using a stepper apparatus. Again, the reinforced chip shutter layer advantageously is formed simultaneously with the forming of the reinforced alignment marks and the reinforced shutter layer. Hence, the reinforced chip shutter layer can also be self-aligned.

Advantageously the method further comprises the steps of hard baking the photoresist layer between steps (d) and (e) followed by directing another optical beam everywhere on the top surface of the photoresist layer.

Only for the sake of clarity, none of the FIGURES is drawn to any scale.

DETAILED DESCRIPTION

Figure 2:
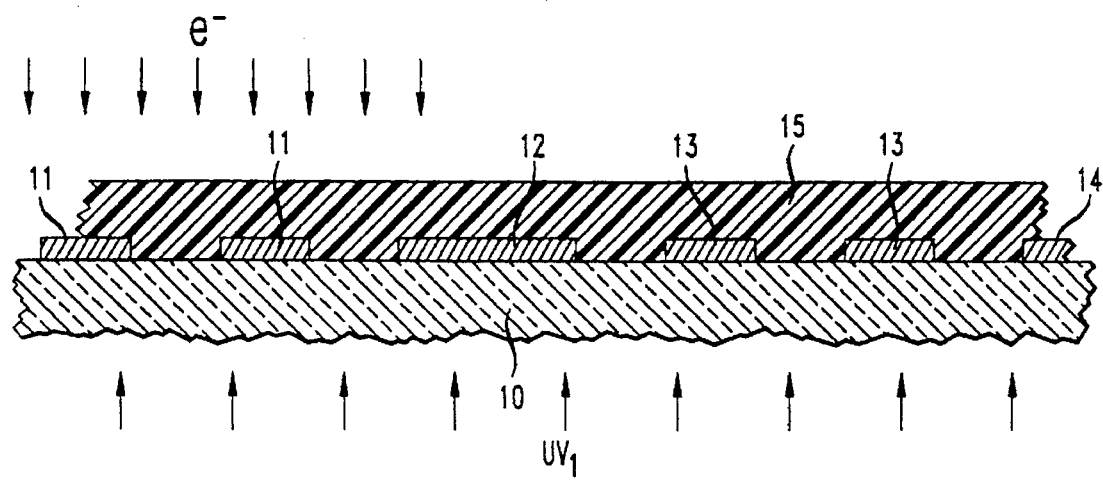
FIGS. 2–7 depict cross-sectional elevation views of various successive stages of a phase-shifting mask being fabricated in accordance with a specific embodiment of the invention.

Referring now to FIG. 2, a substrate 10 is typically made of (transparent) quartz in the form of a parallel slab. The substrate 10 supports a partially transparent, patterned layer of chromium oxynitride. This partially transparent, patterned layer of chromium oxynitride has four basic regions: a first region comprising mask imaging features in the form of partially transparent, patterned layer elements 11 ("mask imaging features 11"); a second region comprising a partially transparent, localized layer element 12 ("alignment mark shutter 12"); a third region comprising partially transparent, patterned layer elements 13 ("alignment marks 13"); and a fourth region comprising a partially transparent, localized layer element 14 ("chip shutter"). These four regions are coated with a photoresist layer 15, typically AZ5206 supplied by Hoechst Celanese Corporation, whose address is Electronics Products Division, 3070 Highway 22 West, Somerville, N.J. 08876.

As further indicated in FIG. 2, a direct writing electron beam $e^-$ is directed on the resist layer 15 at regions thereof overlying only the first region and an adjacent portion of the second region. Thus the photoresist layer 15 is bombarded by the electron beam $e^-$ at all regions thereof overlying the patterned mask imaging features 11 and an adjacent portion of the mask shutter 12, but not in any region overlying any of the alignment marks 13 or the chip shutter 14. Either before, after, or simultaneously with the bombardment of the photoresist layer 15 with the electron beam $e^-$, the bottom surface of the substrate 10 is irradiated with a flood ultraviolet beam $UV_1$, whereby the photoresist layer 15 is exposed to the ultraviolet beam $UV_1$ in those regions thereof and only those regions thereof that overlie the lateral spaces between adjacent ones of the partially transparent elements 11, 12, 13, and 14—i.e., not in those regions that overlie any of the partially transparent elements 11, 12, 13, or 14. Typically the wavelength $\lambda_1$ of the ultraviolet beam $UV_1$ is in the approximate range of 350-to-450 nm.

Figure 3:
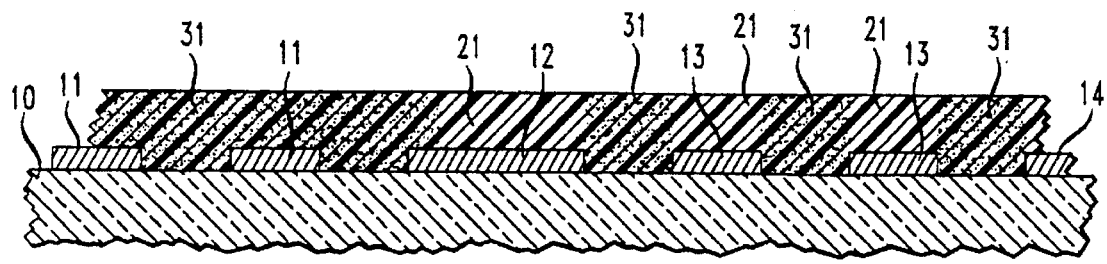
Figure 4:
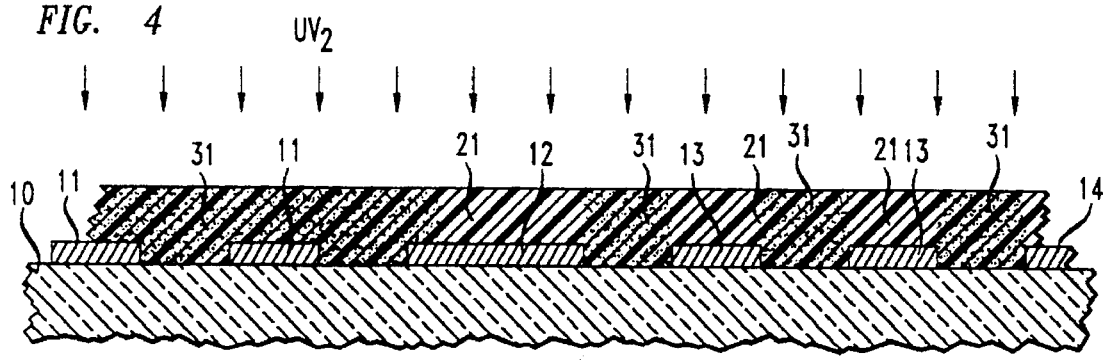
Figure 5:
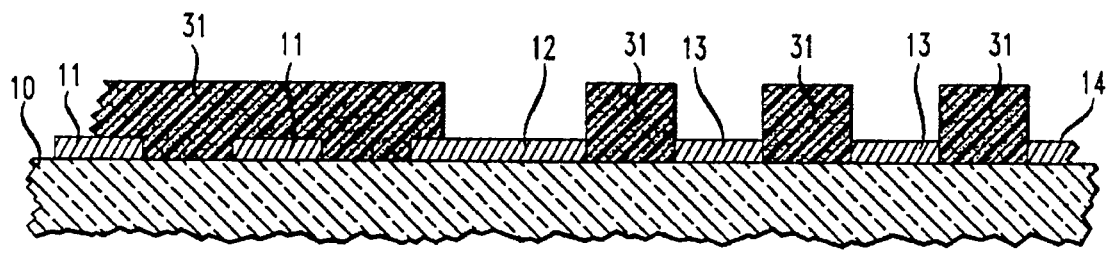

The photoresist layer 15 is then baked at a sufficient temperature and for a sufficient time to cross-link the regions thereof that have been exposed to the $UV_1$ beam, to the $e^-$ beam, or to both. Thus, as indicated in FIG. 3, the regions 31 but not the regions 21 of the photoresist layer become cross-linked. Next, as indicated in FIG. 4, the top surface of the photoresist layer is irradiated with another ultraviolet beam $UV_2$, whereby the non-cross-linked regions 21 of the photoresist layer—but not the cross-linked regions 31 thereof—become soluble in a standard developing solution such as a solution of TMAH (tetramethyl ammonium hydroxide) in water with a normality in the approximate range of 0.1 to 0.5. Typically, the wavelength(s) of the beam $UV_2$ is (are) essentially the same as that (those) of the beam $UV_1$; that is to say, the two beams $UV_1$ and $UV_2$ have essentially the same spectral content. A suitable developing solution removes the regions 21 of the photoresist, whereby only the regions 31 of the photoresist remain intact-as indicated in FIG. 5. In this way, corresponding areas of the partially transparent elements 12, 13, and 14 (but not the mask imaging features 11) become exposed.

Figure 6:
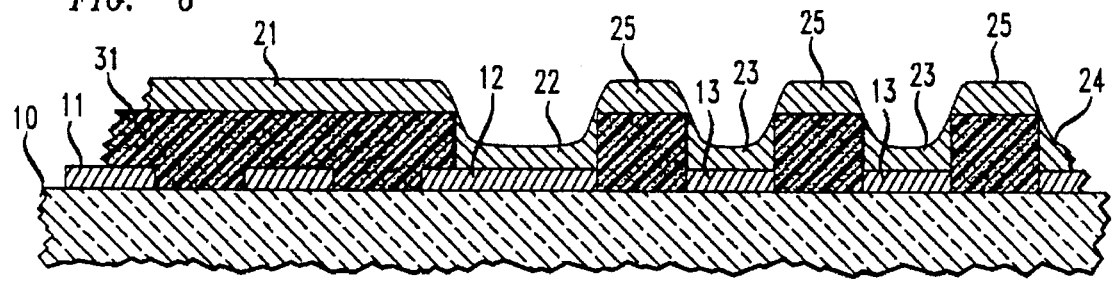

Then, as indicated in FIG. 6, a layer 21, 25 of chromium ("chrome"; Cr) or chromium oxide is sputtered onto the top surface of the remaining regions 31 of the photoresist layer, and at the same time a layer of chromium or chromium oxide is sputtered 22, 23, 24 on the exposed areas of the elements 12, 13, and 14, respectively. Advantageously, the thickness of this layer of chromium or chromium oxide is very thin, typically approximately 50 nm. The composition of this layer is important only to the extent that it is sufficiently opaque and that it adheres well to the underlying layers 12 and 13. It is preferable that this layer of chromium or chromium oxide be thinner than approximately one-third the quantity (H−h), where H represents the height of the photoresist layer 31, and h represents the common thickness of the partially transparent elements 11, 12, 13, and 14.

Figure 7:
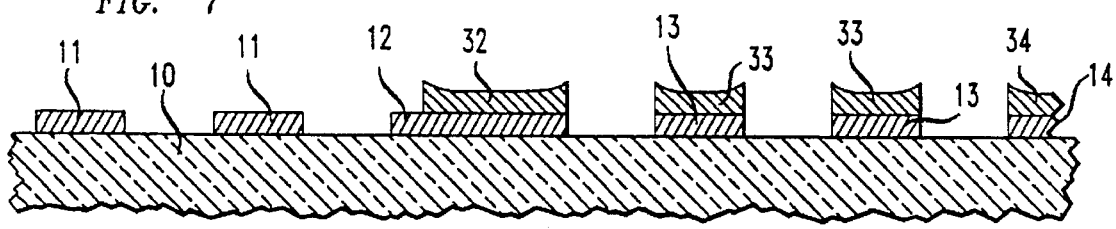

Next, as indicated in FIG. 7, the layer 21, 25 of chromium or chromium oxide is removed by a lift-off process, i.e., by a process of dissolving the remaining regions 31 of the photoresist layer means of a resist stripping solution that attacks the remaining cross-linked regions 31 of the photoresist layer. Typically this stripping solution is a ketone, acetone, or a methyl ethyl ketone. During this liftoff process, the chromium or chromium oxide layer 22, 23, 24 is not removed: i.e., the portion of the chromium or chromium oxide that overlies the elements 12, 13, and 14, respectively, remains intact as reinforcing layers 32, 33, and 34, respectively. Thus this remaining portion of chromium or chromium oxide reinforces the alignment mark shutter 12, the alignment marks 13, and the chip shutter 14, whereby there are formed the following items: a reinforced alignment mark shutter layer 12,32; reinforced alignment marks 13,33; and a reinforced chip shutter 14,34.

Figure 1:
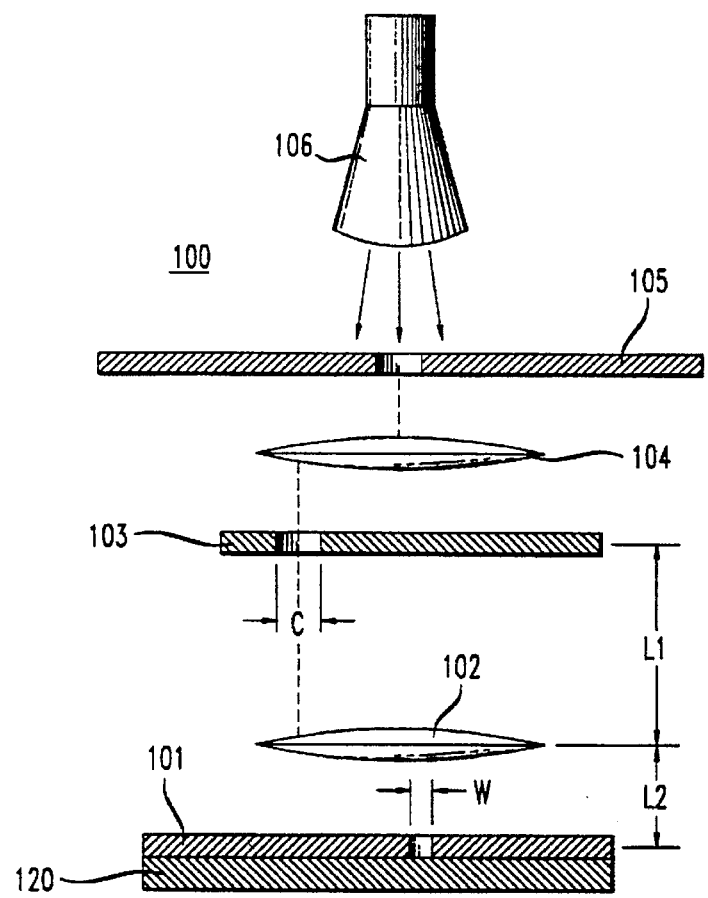
FIG. 1 depicts an optical lithographic system useful in the practice of this invention.

The reinforced alignment mark shutter 12, 32 is self-aligned with respect to the mask imaging features 11 because the patterned layer 12 was defined and fabricated simultaneously with these mask imaging features 11. To achieve this self alignment, the edge of the electron beam e⁻ (FIG. 1) located overlying the alignment mark shutter 12 obviously need not be precisely aligned with the edge of the alignment mark shutter 12 itself: it is sufficient that the edge of the beam e⁻ falls somewhere on this alignment mark shutter 12, preferably at a location thereon remote from the alignment marks 13. Similarly, the reinforced alignment marks 13,33 are self-aligned with respect to the reinforced chip shutter 14,34.

The thickness of the partially transparent layers 11, 12, 13, and 14 is illustratively in the approximate range of 20 nm to 35 nm, typically approximately 32 nm. The thickness of the chromium or chromium oxide layers 21, 22, 23, and 24 illustratively is in the approximate range of 40 nm to 60 nm, typically approximately 50 nm. The width of each of the mask imaging features 11 is typically in the approximate range of 1 μm to 10 μm. The width of the alignment shutter 12 can be anywhere from approximately 2 μm to 5 cm. The widths of the alignment marks 13 can be in the approximate range of 5 μm to 50 μm, depending on such factors as the stepper apparatus to be used in the system 100. The width of the chip shutter 14 is typically larger than approximately 0.5 cm.

Although the invention has been described in detail in terms of a specific embodiment, various modifications can be made without departing from the scope of the invention. Instead of chromium oxynitride, the layers 11, 12, 13, and 14 can be essentially a thickness of molybdenum silicide-oxide that is partially transparent to the optical radiation of wavelength λ, in which case the layers 21, 22, 23, 24, and 25 can be essentially chrome or chromium oxide having a sufficient thickness to be opaque to the radiation λ. In any event, the layers 22, 23, and 24 (and hence the layers 32, 33, and 34) need not of themselves be opaque to the optical radiation of wavelength λ: only the respective combinations of the layers 32, 33, and 34 with the layers 12, 13, and 14, respectively, need be opaque thereto.

The invention claimed is:

1. An optical lithographic mask comprising:
   (a) a substrate that is transparent to optical radiation of wavelength
   (b) a patterned layer of elements each of which comprises a layer of a first material that is partially transparent to the optical radiation of wavelength λ and is located on a top major surface of the substrate;
   (c) one or more reinforced alignment marks located on the top major surface of the substrate, each of the alignment marks comprising a layer of the first material having a top major surface that is entirely overlain with a layer of second material that is chemically different from that of the first material, a lateral space thereby being defined between one of the alignment marks and an adjacent one of the elements, each of the reinforced marks being opaque with respect to the optical radiation of wavelength λ;
   (d) a reinforced alignment shutter layer comprising a first layer of the first material having only a portion of a top major surface thereof overlain with a second layer of the second material,
      neither the lateral space nor any of the elements being overlain with any of the second material, and
      the thicknesses of the layers of the first material in the patterned layer of elements, in the reinforced alignment marks, and in the reinforced alignment shutter layer being mutually substantially equal, and
      the thicknesses of the layers of the second material in the reinforced alignment marks and in the reinforced alignment shutter layer being mutually substantially equal.

2. The mask of claim 1 further comprising a reinforced chip shutter layer, located on the top major surface of the substrate, comprising a layer of the second material overlying a layer of the first material, each having the same lateral extent as the other, and each composed of the same respective materials and thicknesses as those of the first and second layers, respectively.

3. The mask of claim 2 in which the second material is essentially chrome or chromium oxide.

4. The mask of claim 2 in which the first material is essentially chromium oxynitride.

5. The mask of claim 4 in which the second material is essentially chrome or chromium oxide.

6. The mask of claim 1 in which the second material is essentially chrome or chromium oxide.

7. The mask of claim 1 in which the first material is essentially chromium oxynitride.

8. The mask of claim 7 in which the second material is essentially chrome or chromium oxide.

9. A method of making an optical lithographic mask comprising the steps of:
   (a) providing a transparent substrate on a top major surface of which is located a patterned first layer of first material having a common first thickness h and that is partially transparent to optical radiation of a wavelength λ, the patterned first layer having respective portions located within at least first and second areas of the top major surface;
   (b) forming a photoresist layer of height H on the top surface of the patterned first layer and on the top major surface of the substrate;
   (c) bombarding the photoresist layer with an electron beam at all regions thereof overlying the first area, at only a portion of the region thereof overlying the second area, and at a region thereof intervening between mutually adjacent layers of the first and second areas;
   (d) directing an optical beam everywhere on the bottom surface of the photoresist layer before, during, or after step (c);
   (e) developing the photoresist layer, whereby those portions and only those lateral portions of the photoresist layer are intact after the developing that either (1) were bombarded by the electron beam, or (2) are located in the second area but neither were bombarded by the electron beam nor overlie the patterned layer;

(f) depositing a second layer of second material, chemically different from the first material, everywhere on the top surface of the remaining intact portions of the photoresist layer and on all areas of the patterned first layer that are not overlain with the remaining portions of the photoresist layer, the second layer being sufficiently thick so as to be, in combination with the patterned first layer, opaque to the radiation of wavelength $\lambda$; and (g) stripping the remaining portions of the photoresist layer, whereby the second layer is removed at all regions thereof overlying the remaining portions of the photoresist layer but is not removed from any regions not overlying the remaining photoresist layer.

10. A photolithographic method including the steps of:

(a) forming the mask in accordance with the steps of claim 9;

(b) directing optical radiation of wavelength $\lambda$ onto the mask, and focusing resulting optical radiation propagating through the mask onto a second photoresist layer located on a major surface of a wafer or onto a layer of substance located on the major surface of the wafer;

(c) developing the second photoresist layer, whereby an edge feature is formed therein; and (d) forming a feature at the major surface of the wafer or in the layer of substance, respectively, in accordance with the edge feature in the second photoresist layer.

11. A method of making an optical lithographic mask in accordance with claim 9 further comprising, subsequent to step (d) but prior to step (e) thereof, the step of (h) directing another optical beam everywhere on the top surface of the photoresist layer.

12. A photolithographic method including the steps of:

(a) forming the mask in accordance with the steps of claim 11;

(b) directing optical radiation of wavelength $\lambda$ onto the mask, and focusing resulting optical radiation propagating through the mask onto a second photoresist layer located on a major surface of a wafer or onto a layer of substance located on the major surface of the wafer;

(c) developing the second photoresist layer, whereby an edge feature is formed therein; and (d) forming a feature at the major surface of the wafer or in the layer of substance, respectively, in accordance with the edge feature in the second photoresist layer.

13. The method of claim 11 further comprising, subsequent to step (d) but prior to step (h), the step of baking the photoresist layer.

14. A photolithographic method including the steps of:

(a) forming the mask in accordance with the steps of claim 13;

(b) directing optical radiation of wavelength $\lambda$ onto the mask, and focusing resulting optical radiation propagating through the mask onto a second photoresist layer located on a major surface of a wafer or onto a layer of substance located on the major surface of the wafer;

(c) developing the second photoresist layer, whereby an edge feature is formed therein; and (d) forming a feature at the major surface of the wafer or in the layer of substance, respectively, in accordance with the edge feature in the second photoresist layer.

15. The method of claim 13 in which the optical beams of steps (d) and (h) have respective spectral contents that are essentially the same.

16. A photolithographic method including the steps of:

(a) forming the mask in accordance with the steps of claim 15;

(b) directing optical radiation of wavelength $\lambda$ onto the mask, and focusing resulting optical radiation propagating through the mask onto a second photoresist layer located on a major surface of a wafer or onto a layer of substance located on the major surface of the wafer;

(c) developing the second photoresist layer, whereby an edge feature is formed therein; and (d) forming a feature at the major surface of the wafer or in the layer of substance, respectively, in accordance with the edge feature in the second photoresist layer.

17. The method of claim 9 in which the first layer is deposited by sputtering chromium, oxygen, and nitrogen.

18. A photolithographic method including the steps of:

(a) forming the mask in accordance with claim 17;

(b) directing optical radiation of wavelength $\lambda$ onto the mask, and focusing resulting optical radiation propagating through the mask onto a second photoresist layer located on a major surface of a wafer or onto a layer of substance located on the major surface of the wafer;

(c) developing the second photoresist layer, whereby an edge feature is formed therein; and (d) forming a feature at the major surface of the wafer or in the layer of substance, respectively, in accordance with the edge feature in the second photoresist layer.

19. The method of claim 17 in which step (f) includes depositing chromium or chromium oxide, whereby the patterned layer is provided.

20. A photolithographic method including the steps of:

(a) forming the mask of claim 19;

(b) directing optical radiation of wavelength $\lambda$ onto the mask, and focusing resulting optical radiation propagating through the mask onto a second photoresist layer located on a major surface of a wafer or onto a layer of substance located on the major surface of the wafer;

(c) developing the second photoresist layer, whereby an edge feature is formed therein; and (d) forming a feature at the major surface of the wafer or in the layer of substance, respectively, in accordance with the edge feature in the second photoresist layer.

* * * * *